United States Patent [19]

Fukuda et al.

[11] 4,101,361
[45] Jul. 18, 1978

[54] METHOD OF MANUFACTURING LAMINATED BUSES

[75] Inventors: Shunichi Fukuda, Inashiki; Masaaki Muto; Syoichi Iwabuchi, both of Tuchiura, all of Japan

[73] Assignee: Nippon Mektron Kabushiki Kaisha, Japan

[21] Appl. No.: 776,303

[22] Filed: Mar. 10, 1977

[30] Foreign Application Priority Data

Oct. 9, 1976 [JP] Japan .................. 51-121463

[51] Int. Cl.² .................. B32B 31/00; B23P 17/00; H01B 13/00
[52] U.S. Cl. .................. 156/250; 29/624; 29/418
[58] Field of Search .................. 156/250; 29/624, 418

[56] References Cited

U.S. PATENT DOCUMENTS

| | | | |
|---|---|---|---|
| 3,708,609 | 1/1973 | Iosue | 29/624 |
| 3,886,654 | 6/1975 | Erdle | 29/624 |

Primary Examiner—Douglas J. Drummond

[57] ABSTRACT

A method of manufacturing laminated buses begins with a step of preparing a number of perforated sheets, each comprising a number of parallel conductor elements each of which has terminals formed at desired intervals along its length, ribs connecting the conductor elements to one another widthwise, and an outer frame connected to the connecting ribs and surrounding and integrally holding all of the conductor elements. Next, one of the perforated sheets is held at its outer frame by a jig, and an insulating material is temporarily bonded to the individual conductor elements as well as to the outer frame. The procedure is repeated until another perforated sheet and another insulating material are alternately laminated over the aforesaid insulating material. In or before the final step of finishing, all of the connecting ribs are trimmed off from the conductor elements and the resulting laminates are pressed to a desired shape.

19 Claims, 17 Drawing Figures

METHOD OF MANUFACTURING LAMINATED BUSES

BACKGROUND OF THE INVENTION

This invention relates to a method of manufacturing laminated buses for use, for example, with substrates for printed circuitry.

Figure 1A:
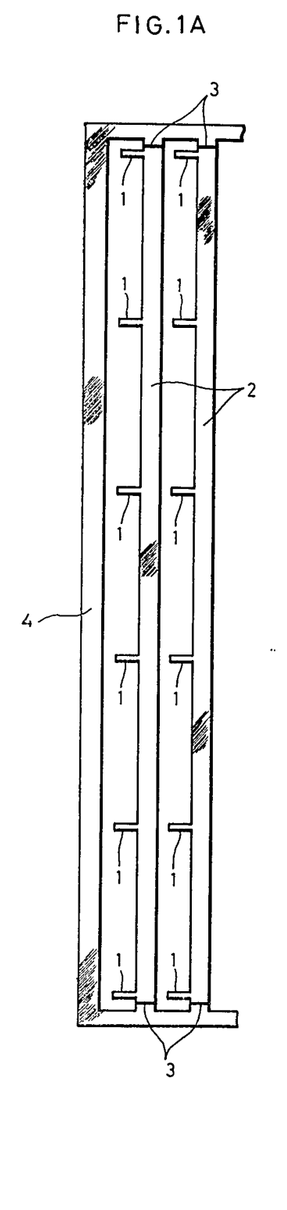
FIGS. 1A and 1B are fragmentary plan views of perforated sheets including conductor elements formed in a conventional way.
Figure 1B:
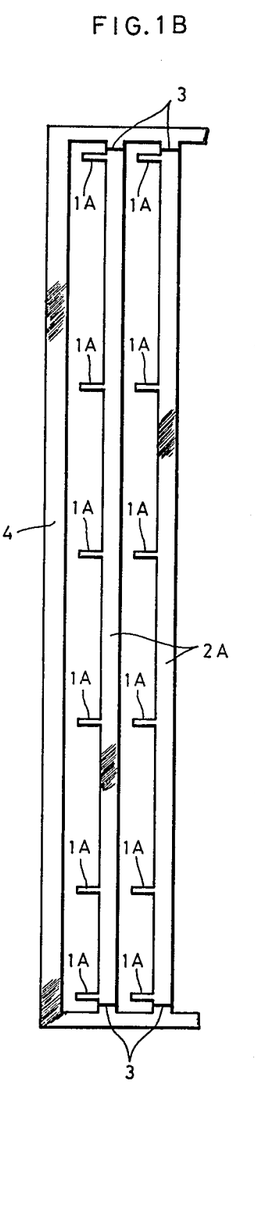
Figure 2:
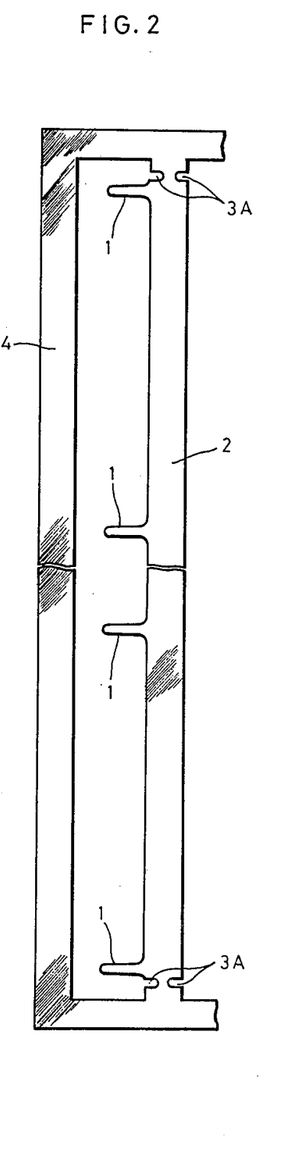
FIG. 2 is a fragmentary plan view, on an enlarged scale, of another example of a conventional perforated sheet from which a conductor element is made separable in a different way.
Figure 3:
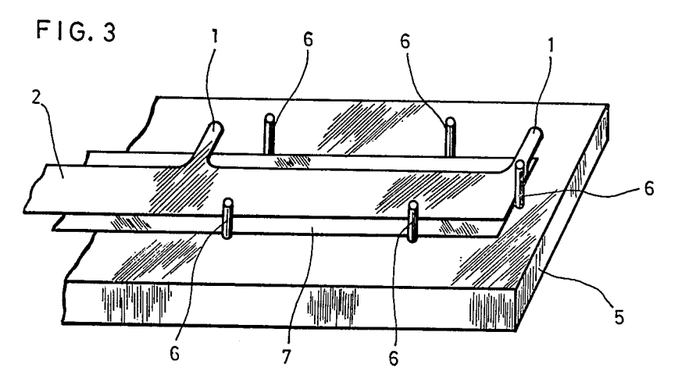
FIG. 3 is a perspective view of a jig on which each laminate is formed by superposing the components one by one in matched position.

Heretofore, buses of the type have usually been fabricated in the following way. As shown in FIGS. 1A and 1B, for example, sheet metal is perforated by punching to leave behind a plurality of conductor elements 2 in the form of parallel bands each having a number of terminals 1 extending widthwise at regular intervals. The conductor elements 2 have cuts 3 made at both ends so that they can be subsequently bent and torn off thereat from the rest of perforated sheet, or square outer frame 4. A number of such perforated sheets are prepared in this manner. The sheet shown in FIG. 1B is the same as the sheet of FIG. 1A except that the conductor elements 2A in this case have terminals 2A formed at intervals different from those of the former. The worker bends these perforated sheets by hand at the cuts 3 to sever the conductor elements 2 and 2A from the outer frames 4. Such cuts 3 may be replaced by necks 3A, formed by opposite notches as shown in FIG. 2, which may also be bent and torn off manually. The conductor elements 2 are thus severed one by one from the square outer frame 4 and, as shown in FIG. 3, the first of the elements is suitably placed on, and temporarily bonded to, a strip of surface insulating tape 7 broader than the elements 2 and 2A and which, in turn, rests on a surface portion of a jig 5 defined by pins 6 for positioning. Next, with the interposition of an interlayer insulating tape not shown, the other conductor element 2A is attached. This lamination procedure is repeated the number of times required. Finally, the resulting laminate is pressed and formed by heat sealing or other suitable means so that the excessive portions of the surface and interlayer insulating tapes are integrally bonded to the product, and a laminated bus with protruding terminals 1, 1A is obtained.

The aforedescribed method of the prior art is inefficient in that a number of the conductor elements 2, 2A must be first severed one by one from the porforated sheets and, for each laminated bus to be made, the temporary bonding and positioning for lamination of the elements are necessary. To be more exact, there are two major factors responsible for the inefficiency. One is that, in bonding the conductor elements 2, 2A to the surface insulating tape 7 and interlayer insulating tapes, care should be used to measure with the eye and leave equal spaces along the both edges of each element on each tape, as shown in FIG. 3. The other is that the edges of the conductor elements 2, 2A to be laminated with the interlayer insulating tapes should be trued up as precisely as possible.

In addition, the laminated buses thus obtained must be individually handled in subsequent operations which may sometimes be required, such as bending of their terminals 1, 1A, marking, and/or inspection. for these reasons the conventional technique can hardly give laminated buses at low cost due to mass production.

SUMMARY OF THE INVENTION

It is an object of the present invention to provide a method of manufacturing laminated buses free of the foregoing disadvantages and, particularly, adapted for quantity production. According to the invention, the problems of matching of conductor elements for temporary bonding and lamination are completely solved and high-quality products can be manufactured with good efficiency.

Another object of the invention is to provide a method of manufacturing a number of products simultaneously rather than one by one as in the past. Under the invention, therefore, a number of conductor elements of a desired length are formed in parallel and connected to one another widthwise by connecting ribs, and the number of conductor elements are surrounded by an outer frame and supported thereby with end connecting ribs so as to form an integral perforated sheet. A number of such perforated sheets are placed one over another, using the outer frames in positioning for lamination, and surface and interlaying insulating materials can be placed alternately with the sheets at the same time. It is intended that after the connecting ribs have been cut off the insulating materials alone enable the conductor elements to be supported by the superposed outer frames.

Still another object of the invention is to provide a method of manufacturing laminated buses which comprises the steps of pressing and forming the number of laminates, supported by the outer frames with insulating materials as above described, and then subjecting the laminates sequentially to marking and bending of the terminals necessary for the finishing of the products, and inspection of the final products.

The present invention will be better understood from the following detailed description when taken in connection with the accompanying drawings showing examples thereof.

DESCRIPTION OF THE PREFERRED EMBODIMENTS

Figure 4:
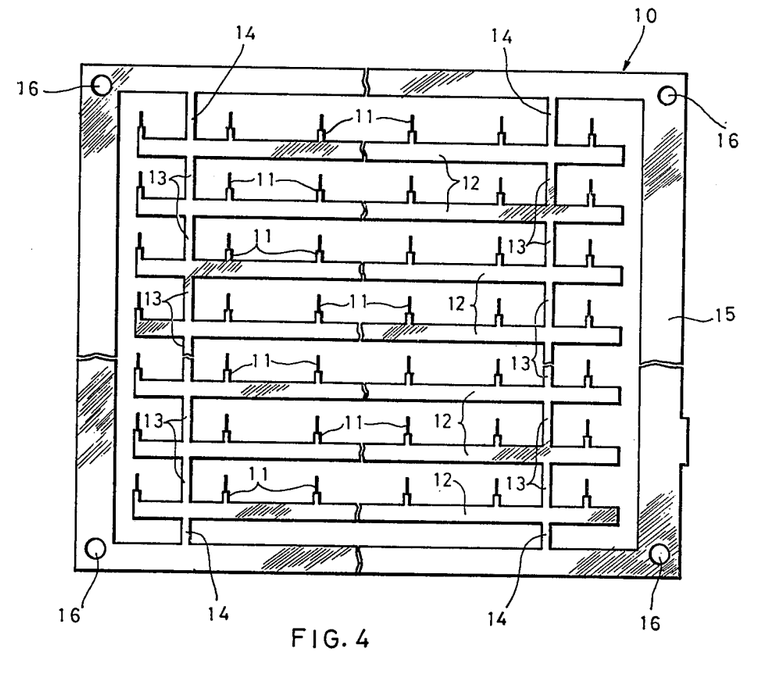
FIG. 4 is a plan view of an example of perforated sheet for use in the method of the invention.
Figure 5:
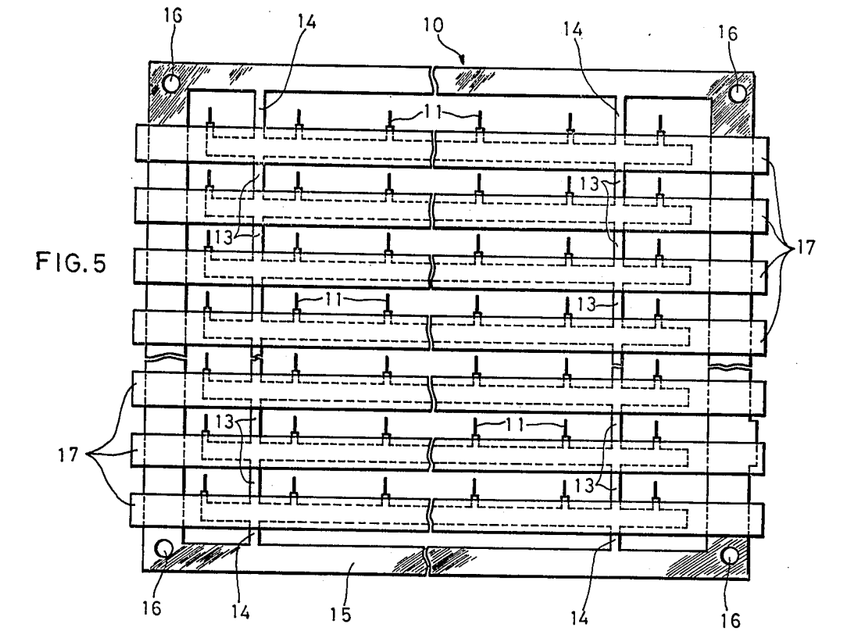
FIG. 5 is a view similar to FIG. 4, showning that an interlayer insulating material is temporarily bonded to the conductor elements and the outer frame of the perforated sheet.
Figure 7:
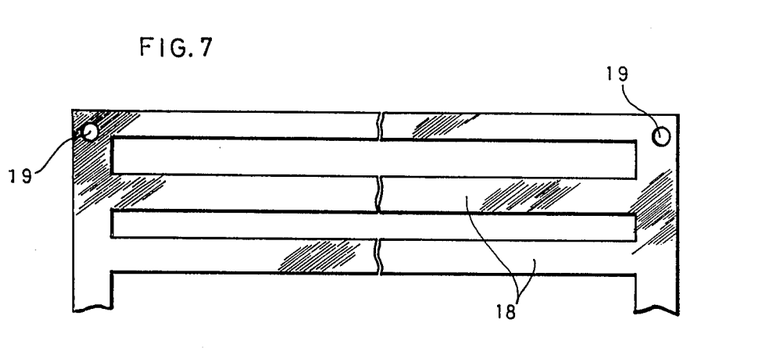
FIG. 7 is a fragmentary plan view of an interlayer or surface insulating material of the same contour as the perforated sheet.

Referring to FIG. 4, an integrally perforated sheet for the practice of the invention is generally indicated at 10. It consists of sheet metal, such as copper, suitably formed by punching or the like to include; a plurality of conductor elements 12 in the form of parallel bands each having a number of terminals 11 extended perpendicularly to the axis of the band at given interals; intermediate connecting ribs 13 interconnecting the conductor elements 12 together not lengthwise but widthwise as shown, and end connecting ribs 14 extending from the uppermost and lowermost elements as viewed in FIG. 4; a square outer frame 15 surrounding and holding the assembly of conductor elements 12 with the end connecting ribs 14; and locating holes 16 formed at the four corners of the frame 15. According to the method of the invention, the perforated sheet 10 is securely placed on a jig not shown, with the holes 16 receiving corresponding pins of the jig. Immediately after this, as shown in FIG. 5, tapes of interlayer insulating material 17 of a width adequately greater than that of the elements 12 are temporarily bonded to the elements automatically or manually. The insulating material 17 is in the form of tapes long enough to cover the individual conductor elements 12 and further extend beyond the both end portions of the outer frame 15 at right angles to the axes of the elements so as to provide a common bond to each element and the corresponding end portions of the frame. Instead of using the tapes of insulating material 17 for adhesion to the individual conductor elements 12, it is possible, as illustrated in FIG. 7, to prepare an insulation sheet 18 of substantially the same pattern as the perforated sheet 10 and then simply superpose the two sheets for temporary bonding, with holes 19 formed at the four corners of the sheet 18 aligned to the holes 16 of the perforated sheet 10. Next, another perforated sheet 20 is made which is similar to the sheet shown in FIG. 4 but includes conductor elements 22 with terminals 21 and connecting ribs 23, 24 both staggered in position with respect to those of the sheet 10. Numerals 25 and 26 designate, respectively, the square outer frame and holes formed at the four corners of the frame.

Figure 11:
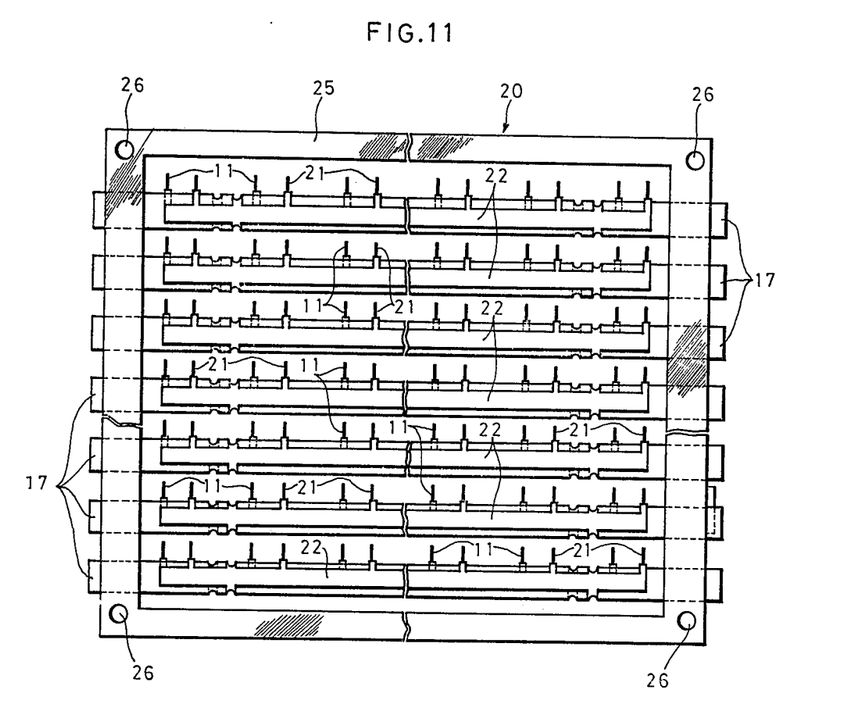
FIG. 11 is a plan view similar to FIG. 6, with the connecting ribs cut off.
Figure 12:
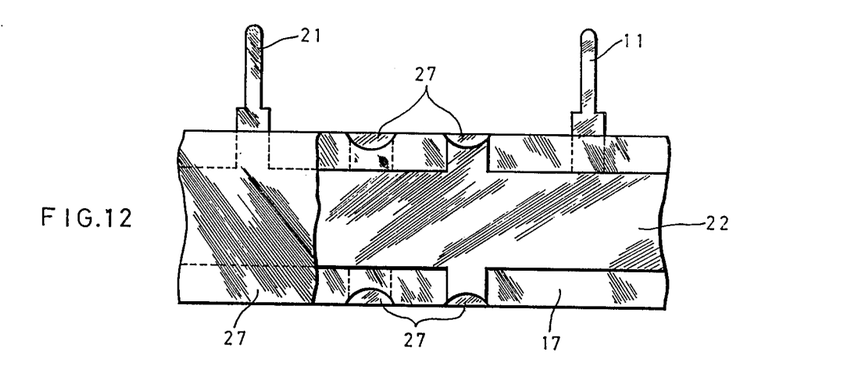
FIG. 12 is a fragmentary plan view of a finished product, with the surface insulating material affixed after the step illustrated in FIG. 11.

In the same fashion as already described, the perforated sheet 20 is positioned with the aid of the holes 26 and is temporarily bonded to the tapes of insulating material 17. With the example shown, this can be done by simply turning over the perforated sheet 10 of FIG. 4 and superposing the reversed sheet with the sheet 20. Following this simple step of temporary lamination of the perforated sheet 10, insulating material 17, and perforated sheet 20, the intermediate connecting ribs 13, 23 and end connecting ribs 14, 24 are removed altogether by trimming with dies, preferably to the state shown in FIG. 11. The tapes of insulating material 17 alone are now able to have the plurality of laminates easily held in matched positions by the outer frames 15, 25. Then, tapes of surface insulating material are affixed to the opposite faces of the both conductor elements 12, 27. In a subsequent pressing operation the individual laminates are compacted and bonded to form final integral pieces. In this stage the tapes of insulating material are suitably cut off at both ends of the laminates close to the outer frames. Then, a number of laminated buses of the construction as typically represented in FIG. 12 are obtained all at once.

Figure 6:
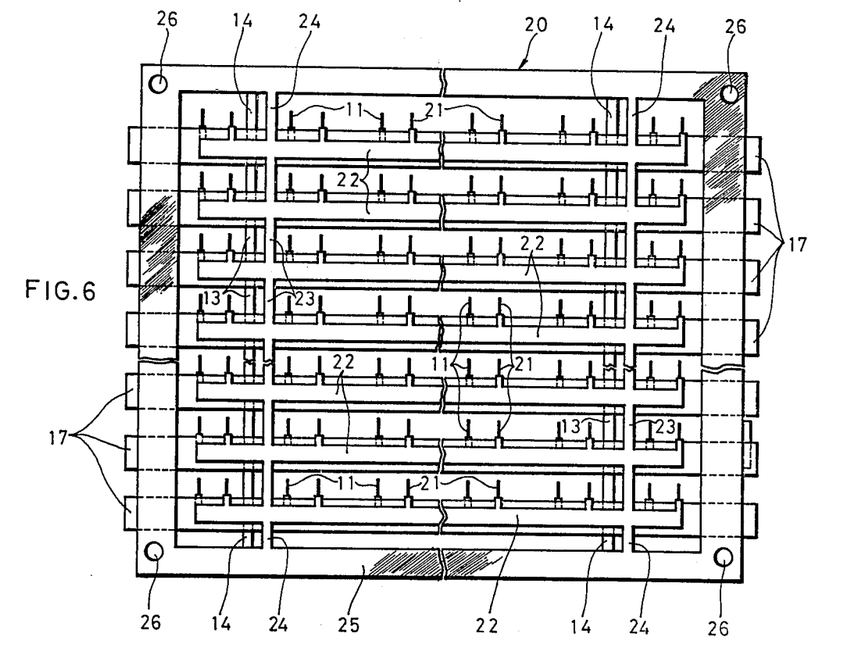
FIG. 6 is a plan view in which the interlayer insulating material is further superposed with another perforated sheet temporarily bonded thereto for lamination.
Figure 8:
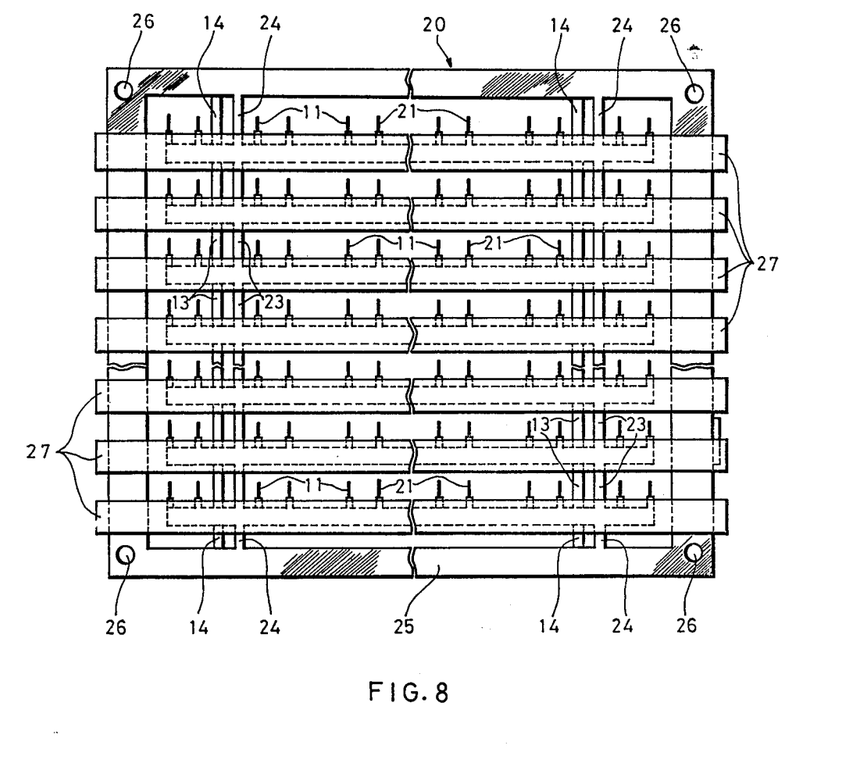
FIG. 8 is a plan view in which the laminate of FIG. 6 is further laminated with a surface insulating material.
Figure 9:
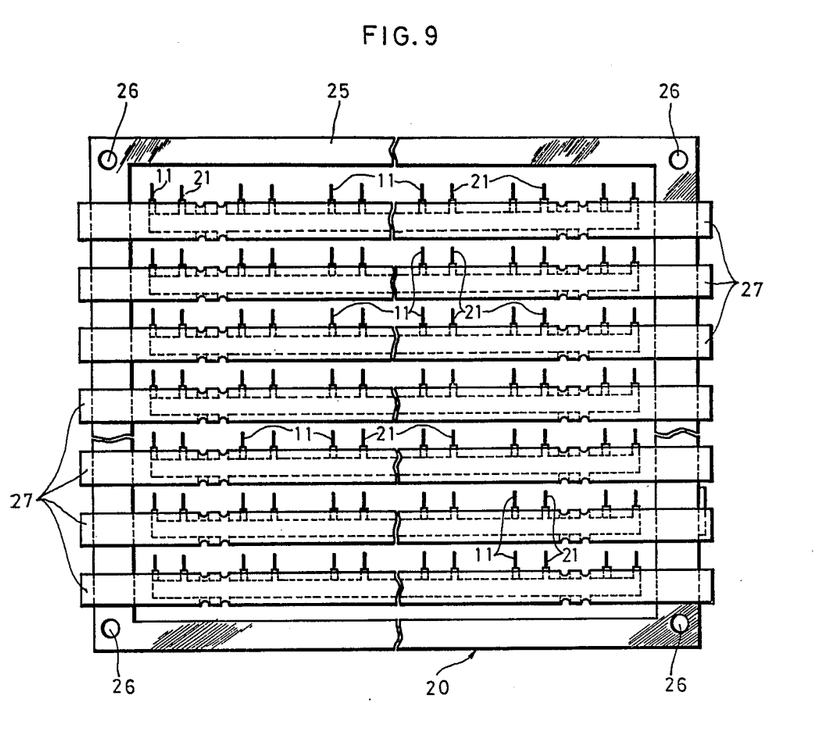
FIG. 9 is a view similar to FIG. 8, with the connecting ribs cut off.
Figure 10A:
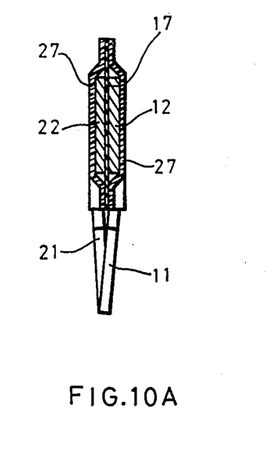
FIGS. 10A and 10B are an enlarged sectional view and a fragmentary plan view, respectively, of a finished product.
Figure 10B:
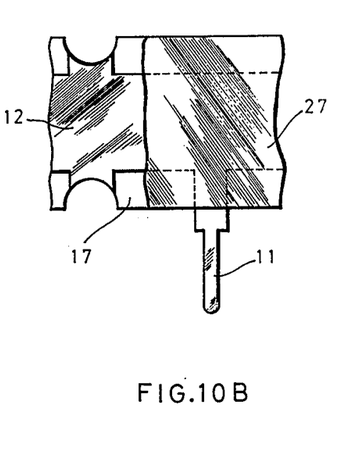

In the case of a modification shown in FIG. 8, the ribs are not first cut off from the both perforated sheets 10, 20 sandwiching the insulating material 17 therebetween. After the fabrication step of FIG. 6, tapes of surface insulating material 27 are directly affixed for temporary bonding to the two opposite faces of the conductor elements 12, 22. Then, the connecting ribs 13, 23, 14 and 24 are altogether cut away as in FIG. 9. This modification permits the lamination to be accomplished in a simultaneous and concentrated manner.

Where the perforated sheets 10 and 20 are to be made of copper, they may range in thickness from 0.2 to 0.5 mm. The copper sheet is desirably tinned or treated with solder over the entire surface to form a deposit not less than 4 microns in thickness. For the temporary bonding of the interlayer insulating material 17 and surface insulating material 27 to the perforated sheets 15, 25 in the example above described, it is desirable to precoat the both sides of the interlayer insulating material 17 and one side of the surface insulating material 27 with adhesive. This makes rapid lamination possible. The adhesive for this purpose may be either a thermosetting adhesive of the phenol or epoxy resin type or a thermoplastic adhesive of the polyester or acrylic resin type. For usual applications the surface insulating material 27 may be a double-layer tape consisting of Mylar film (a polyester film made by Du Pont) and fluorocarbon resin film, and the interlayer insulating material 17 may be a monolayer tape of fluorocarbon resin film. For applications where heat resistance is a requisite, the both insulating materials 12, 27 are desired to be monolayer tapes of polyamide resin film. In accordance with the invention, the intermediate connecting ribs 13, 23 and end connecting ribs 14, 24 are cut off at points a slight distance away from the edges of the conductor elements, as illustrated in FIGS. 10B and 12. For this reason the insulating materials 12, 27 are desired to have a width about twice that of the conductor elements. Thus, the widths of the insulating materials and conductor elements and the relative positions of the connecting ribs 13, 14 on the perforated sheet 10 and the connecting ribs 23, 24 on the other perforated sheet 20 are so chosen that, when the sheets 10, 20 are laminated in the manner above described, their connecting ribs are not superposed but are kept predetermined distances apart. Therefore, the pressing operation that follows the temporary bonding and lamination enables the conductor elements, together with the remnants of the connecting ribs, to be completely covered with the insulating materials 17, 27, as in FIGS. 10B and 12, to give finished products with good electrical characteristics.

Figure 13:
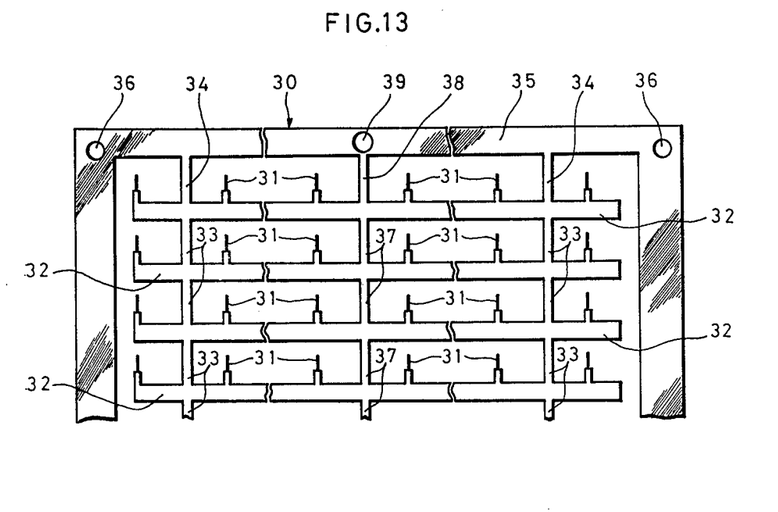
FIG. 13 is a fragmentary plan view of a perforated sheet including elongated conductor elements.

Suitable heating conditions to be used in the final pressing and forming operation in the above example are, where the adhesive is a thermosetting one, at 160° to 180° C for 10 to 20 minutes and, in case of a thermoplastic adhesive, at 120° to 170° C for 5 to 10 minutes.

Where laminated buses of a great length are to be made in accordance with the invention, it is desirable as shown in FIG. 13 to provide intermediate and end connecting ribs 33, 34 near the both ends of the individual conductor elements 32 and also provide similar intermediate and end connecting ribs 37, 38 for the central portions of the elements, so that the elements are integrally formed with, and supported by, the outer frame 35, and the holes to receive the pins of the jig not shown are formed at the four corners 36 and at intermediate points 39 of the outer frame 35. Such perforated sheets 30 formed by punching lend themselves to accurate matching and lamination without the possibility of the conductor elements 32 being distorted during the course of temporary bonding and lamination. While the terminals 11, 21, 31 of the conductor elements 12, 22, 32 in the perforated sheets 10, 20, as well as in the sheets 30, have been illustrated and described as formed only on one and the same edges of the respective elements, it will be appreciated by those skilled in the art that those sheets may be punched to have the terminals formed instead on both edges of the elements.

Figure 14A:
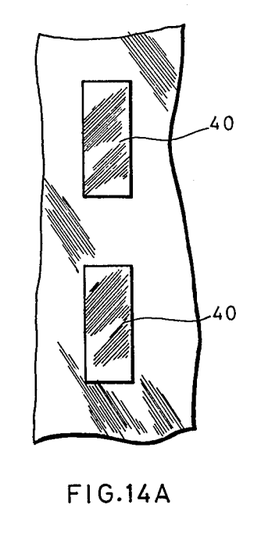
FIGS. 14A and 14B are fragmentary plan views of dies of different contours for trimming off the connecting ribs.
Figure 14B:
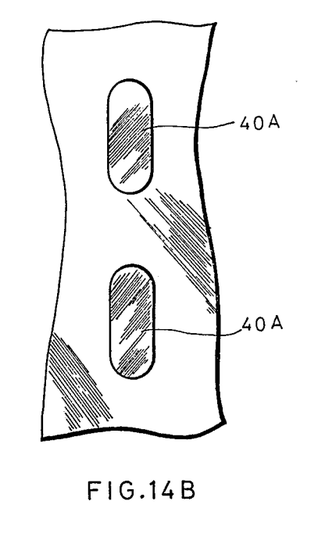

FIGS. 14A and 14B are fragmentary views of dies showing the cutting-edge contours for removing the connecting ribs. As already noted, the connecting ribs 13, 23, or 33 between the adjacent conductor elements 12, 22, or 23 can be cut off, after the temporary bonding and lamination, by rectangular dies 40 or elliptical dies 40A. The end connecting ribs 14, 24, 34 can also be trimmed off in a similar way. For an enhanced cutting efficiency, a plurality of such dies 40 or 40A may be arranged in a row corresponding to the space between the conductor elements so that the connecting ribs between each pair of adjacent elements can be all trimmed off by a single stroke of the die arrangement.

In the final stage following the pressing and forming operation as described above, the surface insulating materials 27 of all conductor element assemblies are simultaneously marked with the name of the products and other necessary data, and are inspected all together. Then, the terminals are bent mechanically with good efficiency and, lastly, the insulating materials at the both ends of the laminates are cut off at points a suitable distance from the ends of the conductor elements. In this simple way a plurality of complete laminated buses are taken away from the superposed outer frames.

The laminated buses thus fabricated are such that, as typically shown in FIGS. 10B and 12, the both conductor elements 12, 22 sandwiching the interlayer insulating material 17 therebetween are accurately superposed and matched, and the both edges of each laminate of conductor elements can be wrapped up with the insulating materials of a uniform width. Consequently, the products display good dielectric strength and other electrical characteristics required of the buses of this type. Also, the method of the invention largely eliminates the cumbersome positioning of the laminates, as on a jig for each laminated bus to be fabricated in accordance with the conventional process. The perforated sheets, each including a plurality of conductor elements, and insulating materials are simply and alternately superposed to attain a laminated and matched state as desired. Even after the removal of the connecting ribs the individual laminates remain supported by the superposed outer frames with the insulating materials. Therefore, the number of products in the finishing stage can be simultaneously pressed and permanently laminated, marked, and inspected after the bending of the terminals. Thus, with a saving of labor, laminated buses of excellent quality can be mass produced with high efficiency and at low cost.

What is claimed is:

1. A method of manufacturing laminated buses comprising:
   (a) stacking and temporarily bonding a plurality of electrically conductive perforated sheets and a plurality of insulating tapes in alternating relation to form a temporarily bonded laminate,
   the perforated sheets comprising a plurality of parallel elongated conductor elements each having sides and ends, formed with terminals, spaced from each other, and spaced from an outer frame surrounding the conductor elements, said perforated sheets having means for connecting the sides of the conductor elements with said frame,
   the insulating tapes being aligned with each of the conductor elements, extending from said ends of said conductor elements to said outer frame and being bonded temporarily to said outer frame;
   (b) removing said means for connecting the sides of the conductor elements with said frames and allowing said conductor elements to be supported to said frame by said insulating tapes; and
   (c) laminating said temporarily bonded laminate to form a bonded laminate including the laminated buses.

2. A method according to claim 1 wherein said laminating of step (c) comprises pressing and heating said temporarily bonded laminate.

3. A method according to claim 2 wherein said temporary bonding of step (a) is accomplished by the use of an unset adhesive, and said laminating of step (c) sets the adhesive.

4. A method according to claim 3 and further including subsequent to step (c);
   (d) removing said buses from said bonded laminate by cutting said insulating tapes a slight distance from buses so as to sever the buses from said outer frames.

5. A method according to claim 4 wherein said means for connecting the sides of the conductor elements with said frame comprises connecting ribs extending from the side of one conductor element to the side of another conductor element and extending from the side of said one conductor element to the outer frame.

6. A method according to claim 5 wherein said connecting ribs of said perforated sheets are disposed in rows to provide for the simultaneous removal of the ribs in each row.

7. A method according to claim 6 wherein said insulating tapes are spaced in parallel relation from one another, have a width and ends, and said ends connected to an outer frame to provide an insulating sheet having said outer frame that is in alignment with the outer frame of the perforated sheets.

8. A method according to claim 7 wherein said outer frames of said perforated sheets and said outer frames of said insulating sheets include holes to allow alignment in a jig.

9. A method according to claim 8 wherein said connecting ribs of said perforated sheets are offset from the position of said connecting ribs when the perforated sheets are turned over and aligned.

10. A method of manufacturing laminated buses comprising:
    (a) stacking and temporarily bonding a plurality of electrically conductive perforated sheets and a plurality of insulating tapes in alternating relation to form a temporarily bonded laminate, the perforated sheets comprising a plurality of parallel elongated conductor elements formed with terminals, spaced from each other, and spaced from an outer frame surrounding the conductor elements, said perforated sheets having means for connecting the conductor elements with said frame, the insulating tapes being aligned with each of the conductor elements and including a portion extending to and bonded temporarily to the outer frame, said portion of the insulating tapes being offset from said means for connecting the conductor elements with said frame;

(b) removing said means for connecting the conductor elements with said frames and allowing said conductor elements to be supported to said frame by said insulating tapes; and (c) laminating said temporarily bonded laminate to form a bonded laminate including the laminated buses.

11. A method according to claim 10 wherein said laminating of step (c) comprises pressing and heating said temporarily bonded laminate.

12. A method according to claim 11 wherein said temporary bonding of step (a) is accomplished by the use of an unset adhesive, and said laminating of step (c) sets the adhesive.

13. A method according to claim 12 and further including subsequent to step (c);

(d) removing said buses from said bonded laminate by cutting said insulating tapes a slight distance from buses so as to sever the buses from said outer frames.

14. A method according to claim 13 wherein said insulating tapes are spaced in parallel relation from one another, have a width and ends, and said ends connected to an outer frame to provide an insulating sheet having said outer frame that is in alignment with the outer frame of the perforated sheets.

15. A method according to claim 14 wherein said outer frames of said perforated sheets and said outer frames of said insulating sheets include holes to allow alignment in a jig.

16. A method of manufacturing laminated buses using a single heating and pressing step and while maintaining the buses on a jig which provides for handling of the buses as a unit comprising:

(a) stacking and temporarily bonding by means consisting essentially of an unset adhesive a plurality of electrically conductive perforated sheets and a plurality of insulating tapes in alternating relation to form a temporarily bonded laminate, the perforated sheets comprising a plurality of parallel elongated conductor elements formed with terminals, spaced from each other, and spaced from an outer frame surrounding the conductor elements, said perforated sheets including connecting ribs for supporting the conductor elements within said frame, the temporarily bonded laminate being supported by said outer frame on a jig which provides for handling of the temporarily bonded laminate as a unit, the insulating tapes being aligned with each of the conductor elements and including a portion extending to and bonded temporarily to the outer frame, said portion of the insulating tapes being offset from said connecting ribs to allow removal of said connecting ribs while maintaining said temporarily bonded laminate on said jig;

(b) removing said connecting ribs and allowing said conductor elements to be supported within said frame by said insulating tapes; and (c) pressing and heating said temporarily bonded laminate to set said adhesive and to form a bonded laminate including the laminated buses.

17. A method according to claim 16 and further including subsequent to step (c);

(d) removing said buses from said bonded laminate by cutting said insulating tapes a slight distance from buses so as to sever the buses from said outer frames.

18. A method according to claim 17 wherein said insulating tapes are spaced in parallel relation from one another, have a width and ends, and said ends are connected to an outer frame to provide an insulating sheet having said outer frame that is in alignment with the outer frame of the perforated sheets.

19. A method according to claim 18 wherein said connecting ribs of said perforated sheets are offset from the position of said connecting ribs when the perforated sheets are turned over and aligned.

* * * * *